United States Patent [19]

Heinemann

[11] Patent Number: 5,237,524

[45] Date of Patent: Aug. 17, 1993

[54] METHOD OF LOW-PASS FILTERING AND ARRANGEMENT FOR PERFORMING SAID METHOD

[75] Inventor: Hartmut Heinemann, Ahrensburg, Fed. Rep. of Germany

[73] Assignee: U.S. Philips Corporation, New York, N.Y.

[21] Appl. No.: 712,219

[22] Filed: Jun. 7, 1991

[30] Foreign Application Priority Data

Jun. 29, 1990 [DE] Fed. Rep. of Germany ....... 4020643

[51] Int. Cl.$^5$ .......................... G06F 15/31; H04N 9/64
[52] U.S. Cl. .................................. 364/724.19; 358/36
[58] Field of Search ...................... 364/724.01, 724.19, 364/723; 381/46; 358/36, 37, 54, 463

[56] References Cited

U.S. PATENT DOCUMENTS

| | | | |
|---|---|---|---|
| 4,331,837 | 5/1982 | Soumagne | 381/46 X |
| 4,868,773 | 9/1989 | Coyle et al. | 364/724.01 |
| 4,894,794 | 1/1990 | Shenk | 364/723 |

*Primary Examiner*—Long T. Nguyen
*Attorney, Agent, or Firm*—Jack D. Slobod

[57] ABSTRACT

Signal smoothing can be improved without simultaneously obliterating the useful input signal edges by adaptively filtering the signal, in which the averaging interval is corresponding to the length of a kernel is incremented or decremented as a function of a difference between an output signal sample computed from the kernel and an output signal sample succeeding the kernel.

4 Claims, 3 Drawing Sheets

METHOD OF LOW-PASS FILTERING AND ARRANGEMENT FOR PERFORMING SAID METHOD

BACKGROUND OF THE INVENTION

1. Field of the Invention

The invention relates to a method of low-pass filtering by means of averaging and to an arrangement for performing such a method.

2. Description of the Related Art

In a digital low pass filtering method known as "moving average" (and described, for example, by Peter Haberäcker in his book "Digitale Bildverarbeitung: Grundlagen und Anwendungen", Carl Hanser Verlag, Munich/Vienna) a filtered signal value is derived from a signal value and a fixed number of adjacent values which jointly form a kernel of signal values by forming the arithmetic average value of this kernel. The term "kernel" is understood to mean a part of the signal consisting of a plurality of adjacent signal values. In order to generate a sequence of such filtered values, the kernel is shifted relatively to the signal by adding a signal value at one side of the kernel and eliminating a signal value at the other side. The length of the kernel defines the filter action. If the kernel length is large, there is a strong signal smoothing, but signal transients are obliterated. If the kernel length is small, there is a weaker smoothing, but a better display of signal transients.

SUMMARY OF THE DRAWING

The present invention has for its object to provide a low-pass filter which with simple means attenuates useful signal transients to a minimum extent and smoothes the signal to a maximum extent, i.e. maximally suppresses the noise superimposed on the information signal. According to the invention this object is solved in that the signal is subjected to an adaptive filtering in which the averaging interval is determined by a slope of the signal.

The method according to the invention may be used for filtering information signals from a variety of sources, e.g. analog and digital audio or video signals in record players, particularly CD players, and in cassette recorders. It can also be used for military tracking and for radar control; it can generally be used in the case of noisy measuring and picture signals, for data transmission and measuring data acquisition and for processing analog or time-discrete signals.

Figure 1:
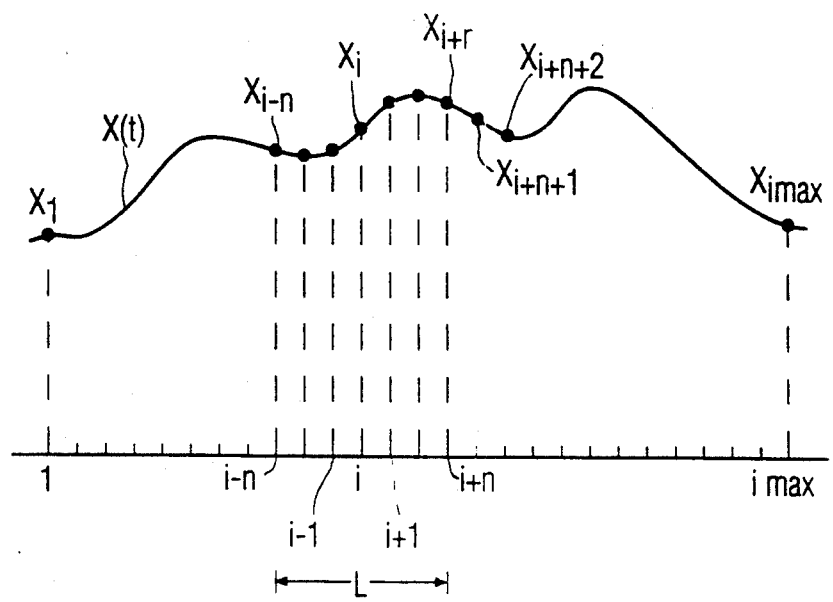

The signal to be filtered can, for example be obtained, by digitizing an analog signal.

The invention can be used for a two-dimensional picture which is scanned line by line by means of at least one sensor and in which the picture values are stored in a digital picture memory, while the signal to be subjected to the low-pass filtering is read from the picture memory in such a way that successive signal values are constituted by vertically adjacent picture values of which are perpendicular to the line direction. In a picture scanned line by line by means of at least one sensor, there are usually no high-frequency signal fluctuations in the line direction. However, these fluctuations may occur perpendicularly to this line direction due to differences in sensitivity of the scanning sensor. These interference components can be effectively eliminated by the method according to the invention, while the actual picture information is not affected by the low-pass filtering if the filter parameters are chosen appropriately.

A preferred embodiment of the method in which the signal is formed by a sequence of digital signal values and in which a filtered signal value is derived from a kernel of signal values, and a sequence of filtered signal values is obtained by shifting the kernel relatively to the signal each time by one sample position is characterized in that at least one of the signal values proximate to the kernel and previously not comprised in the kernel is compared with a value derived from the kernel and in that the kernel length is step-wise increased to a maximum value in the case of small differences and is step-wise reduced to a minimum value in the case of large differences.

This embodiment is based on the recognition that the length of the kernel and hence the amount of the signal smoothing is dynamically adapted to the signal variation. For this purpose the signal is "analyzed" by determining the difference between a value derived from the kernel and a signal value which is before" the kernel, i.e., which has not yet passed through the kernel.

In the case of large differences it is assumed that a real signal transient is present which should be smoothed to a minimum extent by the low-pass filtering. In such a case the "front side" of the kernel remains before the signal transient and the kernel is shortened at the "rear side" by two samples (by eliminating from the kernel the two signal values which have had the longest dwell-time in the kernel) instead of being shifted as a whole. As a result the kernel is further shifted while the kernel length is simultaneously reduced. In the case of strong signal transients this reduction is continued in steps until a minimum kernel length is reached. If the minimum kernel length has the value of 1, this means that there is no smoothing anymore, i.e., the signal passes the filter unchanged. If the minimum value of the kernel length is larger than 1, a minimum smoothing is enforced.

If on the other hand the difference is so small that is might be caused by noise signals, the signal smoothing is intensified. The rear side of the kernel then remains (the signal value having the longest dwell-time in the kernel remains a part of the kernel) and the kernel length is accordingly increased at its front side until a maximum value is reached.

When a maximum value or a minimum value is reached, there is no further increase or reduction, respectively; the kernel is then shifted in the same way as in the known method.

The signal value which is used for determining the difference may be the signal value which—with a constant kernel length—is the next or the next but one to be incorporated in the kernel, or it may be formed from the weighted sum of these values. Similarly, the value derived from the kernel may be constituted by a signal value itself (for example, the value included in the kernel last) or by a suitable combination of signal values in this kernel. However, a preferred embodiment of the invention is characterized in that the difference is formed between the arithmetic mean value of the signal values of the kernel and the signal value being two samples "before" the kernel, in that the kernel length is increased when the difference falls below a first threshold value and in that the kernel length is reduced when the difference does not fall below a second threshold value which is at least as large as the first threshold value. The kernel mean value is then the low-pass filtered value.

The first threshold value should be such that the difference occurring in the case of interference (for example, noise) of the signal usually does not exceed this value. The second threshold value may possibly be equal to the first threshold value.

The filtering process can be controlled within wide limits by using three parameters only:

a) by means of the minimum value of the kernel length; this value fixes the minimum smoothing. If this value is set at "1", there is no smoothing at all and the signal edges pass the filter undistorted. This parameter should be fixed in dependence upon the signal edges.

b) by means of the maximum value of the kernel length; this value fixes the maximum smoothing. This parameter should be chosen in such a way that noise at places without signal edges should be sufficiently well attenuated.

c) by means of the threshold(s); this parameter should be chosen in such a way that interferences in the signal (noise, etc.) do not usually exceed this threshold, but real transients in the useful signal are generally larger than this threshold.

An arrangement for performing the method according to the invention is characterized by a signal source for generating a digital signal, a memory having a memory capacitance which corresponds at least to the maximum value of the kernel length, and a signal processor which utilizes the signal values in the memory for generating a filtered signal value and which is formed in such a way that the kernel length is step-wise increased to a maximum value in the case of small variations within the signal and is step-wise reduced to a minimum value in the case of large deviations.

BRIEF DESCRIPTION OF THE DRAWING

Figure 2:
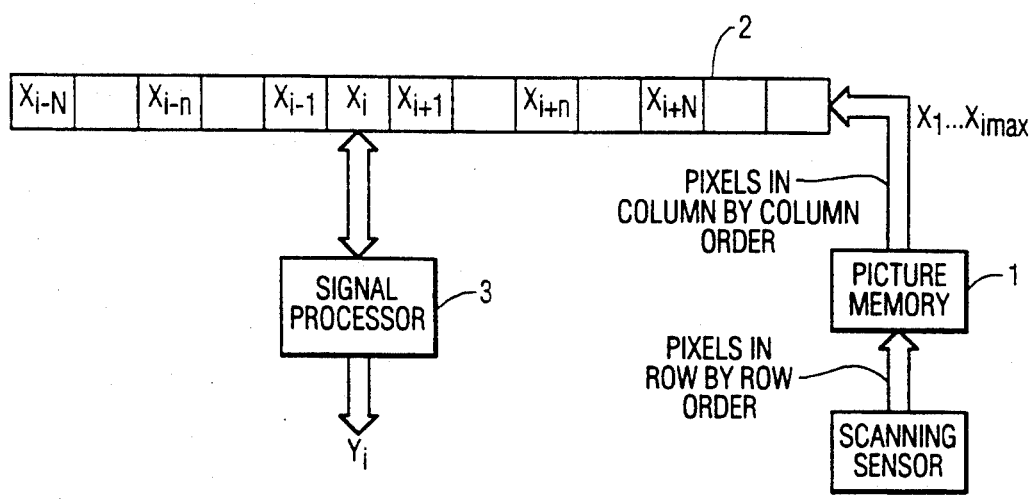
Figure 3:
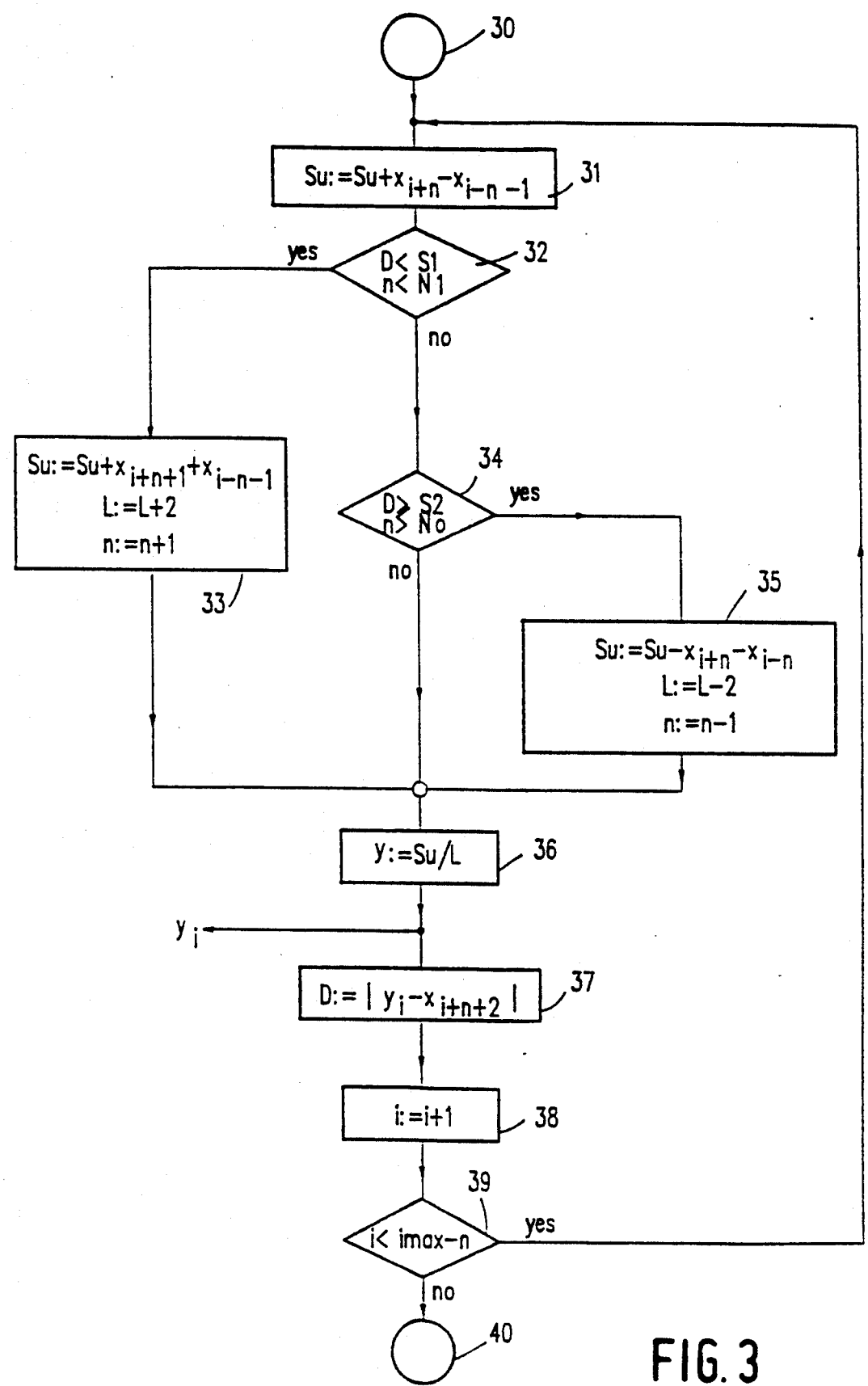
Figure 4:
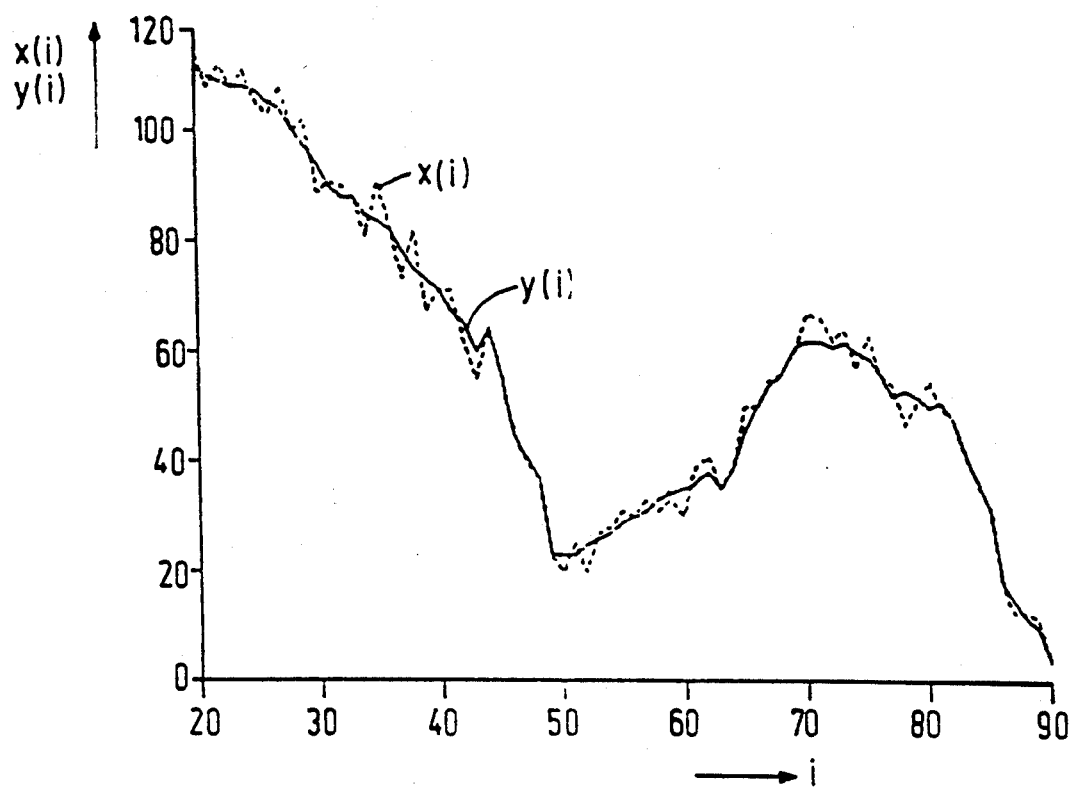
Figure 5:
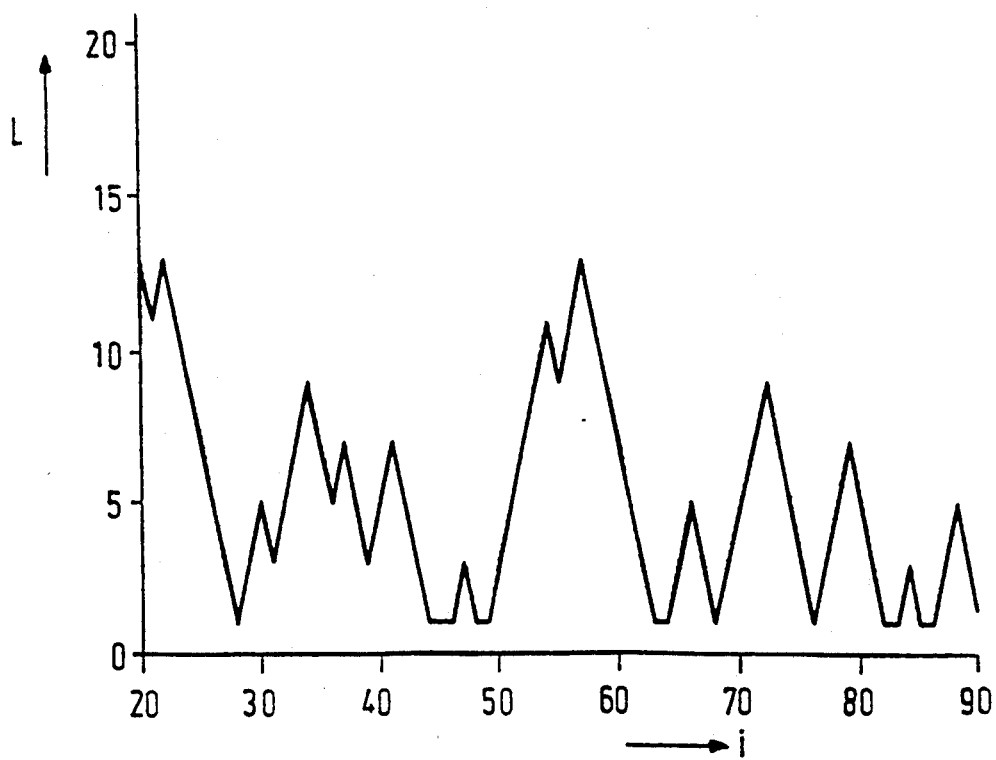

The invention will now be described in greater detail by way of example with reference to the accompanying drawing in which:

FIG. 1 shows a signal formed by a sequence of digital signal values,

FIG. 2 shows an arrangement for low-pass filtering of such a signal,

FIG. 3 shows a flow chart of a program section in accordance with which a computer, for example the programmable signal processor in the arrangement of FIG. 2, processes the signal values, FIG. 4 shows an unfiltered signal and the associated signal processed in accordance with the inventive method, and FIG. 5 shows the respective kernel lengths in the low-pass filtering operation.

DETAILED DESCRIPTION OF THE PREFERRED EMBODIMENTS

FIG. 1 shows a signal comprising a sequence of digital samples $x_1 \ldots x_{imax}$, which may be have been produced, for example, by scanning the signal $x(t)$ at the sample positions $i=1$ to $i=imax$. The samples $x_{i-n} \ldots x_{i+n}$ constitute the kernel for calculating a low-pass filtered value $y_i$ at the sample position i. In the simplest case $y_i$ at the sample position i is computed as the arithmetic mean value of the samples within the kernel. However, it is alternatively possible to compute the filtered value $y_i$ from the appropriately weighted sum of the samples in the kernel. The kernel length L is computed from the value n in accordance with the formula $$L = 2n + 1.$$

In the known method a kernel which has shifted to the right by one sample position relative to the previous kernel is used for computing the filtered value $y_{i+1}$ at the sample position $i+1$. The sample $x_{i-n}$ in the previous kernel is then eliminated from the kernel and the sample $x_{i+n+1}$ is incorporated in the kernel. The length of the kernel then remains constant; only its position relative to the signal is shifted by one sample position.

In contrast, in the invention the length of the kernel is made dependent on the signal variation. For this purpose the difference between the sample $x_{i+n+2}$ lying two positions "before" the kernel and the filtered value $y_i$ is constituted at the sample position i which is, for example, the arithmetic mean value of all values in the kernel.

If this difference is smaller than a threshold S1 provided as an external parameter, not only the sample $(x_{i+n+1})$ at the next sample position is incorporated in the kernel but also the next but one sample $(x_{i+n+2})$; the "oldest" sample in the kernel $(x_{i-n})$ is, however, maintained. The kernel length thus grows by two samples in the case of one shift step, but at most until it has reached its predetermined maximum value.

However, if the difference is larger than the differences usually occurring in the case of conventional signal interferences (noise and the like), the kernel length is reduced by eliminating the newly added sample $(x_{i+n+1})$ and the oldest sample $(x_{i-n-1})$. The sample $(x_{i+n})$ at the front side thus does not change its position in this case when the kernel is shifted and this applies until the kernel length has reached a predetermined minimum value at which the kernel comprises, for example, only one signal value. The signal transient is then processed with this small kernel.

FIG. 2 shows diagrammatically a circuit arrangement for performing the method according to the invention. This circuit has a digital signal source in the form of a picture memory 1 which contains picture values of pixels scanned row by row (line by line) by a sensor 4 and which supplies a sequence of picture values of pixels in a column by column order. The samples are continuously fed into a shift register type memory 2 which has at least two memory sites more than the number of samples comprised in a kernel of maximum length. At each new sample which is read into the memory 2 the sample which have already been stored are shifted by one memory site (to the left in FIG. 2), while the sample which has had the longest dwell-time in the memory disappears (in the relevant case this is the value $x_{i-N}$). A signal processor 3, which can access any one of the memory sites in memory 2, processes the samples and supplies the filtered samples $y_i$. The signal processor may comprise hardware tailored to the problem specification. The signal processor 3 is, however, preferably programmable and comprises a microprocessor or a comparatively large digital computer.

FIG. 3 shows a part of a flow chart of the signal processing program performed by the signal processor. The reference numeral 30 denotes a program section which performs the initiation and supplies the first filtered values for the start of the signal. The program may so far correspond to the known method using a constant kernel length. It has been assumed that a filtered signal value $y_{i-1}$ has been computed for a sample $i-1$ and that in addition the values Su, L, D and i are given. The value Su represents the sum of the samples $(x_{i-n-1} \ldots x_{i+n-1})$ which correspond to the position of the kernel around the sample $i-1$, while L denotes the kernel length associated with the filtered value $y_{i-1}$.

Subsequently, the sum is changed in a program step 31, in which step the sample $x_{i+n}$ is added and the sample $x_{i-n-1}$ is deleted. The newly computed sum value Su therefore corresponds to the sum of the signal values of a kernel around the central value $x_i$.

In program section 32 it is checked whether the value D is smaller than a first threshold value S1 and whether the number n is smaller than a maximum value N1. The first threshold value S1 should be adapted to the noise or interference level so that it can be exceeded by the difference D in the case of variation of the useful signal and not by interferences, noise or the like only. The value N1 represents the maximum value of the kernel of $(2N1+1)$ as being the value to which the kernel length can be increased. It should essentially comprise fewer signal values than the signal to be filtered.

Only when the two conditions are fulfilled the program continues with block 33. In this block the kernel sum (newly computed in 31) is increased by the two samples in either side of the - shifted - kernel. In fact, the sum Su formed in block 33 is distinguished from the original sum Su in that the values denoted by $x_{i+n+1}$ and $x_{i+n}$ in FIG. 1 have been added. This corresponds to the sum of the signal values of a kernel whose length L has been increased by 2 relative to the length of the original kernel and whose central value has been shifted by one sample position (from $i-1$ to i). Consequently, the length L is subsequently increased by 2 and the value n is increased by 1 in the program block 33.

If either one of the two conditions has not been fulfilled in block 32, the program continues with a block 34 in which a further query is performed. In this block it is checked whether the difference D is not smaller than a second threshold value S2 and whether the value n is larger than a minimum value No, for example, larger than 0. The second threshold value S2 must be larger than or equal to the first threshold value S1. If the two threshold values are equal, the kernel length changes continually as long as n remains between the maximum value N1 and the minimum value No; otherwise there is a range in which successive filter values may also have the same kernel length.

When the two conditions of block 34 have been fulfilled, the program continues with a block 35. In this block the kernel sum is newly computed by eliminating the first and the last samples from the sum Su newly computed in block 31. The result is that the two extreme signal values of the kernel shown by means of broken lines in FIG. 1 are not taken into account when forming the sum. This corresponds to the sum of a kernel whose central sample is at $i+1$ and whose length is reduced by 2. Accordingly, the value L is reduced by 2 and the value n is reduced by 1 in block 35.

Even if only one condition of the block 34 has not been fulfilled or if the block 33 or 35 has been passed, the program reaches block 36 in which the filtered value $y_i$ is computed. In the simplest case only the quotient Su/L (arithmetic mean value) is formed for the purpose, in which case Su and L may have been newly computed in one of the blocks 33 or 35 with respect to the value given in block 31. The samples filtered in this way can be supplied in an appropriate manner; however, they can also be taken over by a memory.

Subsequently, the value D is formed as the difference between the filtered value $y_i$ and the signal value $(x_{i+n+2})$ in a block 37. Finally the index i is increased by 1 in block 38 and the new position of the kernel is thus adapted. This can be realised, for example, by shifting all samples in the memory to the respective next memory location.

Finally it is checked in a block 39 whether the kernel has already reached the proximity of the last sample imax. If it has, the end of the program follows in program section 40 with the possible supply of appropriately generated peripheral values.

If on the other hand the condition of the block 39 has been fulfilled, the program returns to block 31 thus forming a program loop which is traversed until the kernel reaches the final range of the signal. If the program runs through the loop several times, it may occur that the block 33 is called each time and that, correspondingly, the kernel length is each time increased by 2 until the maximum value N1 is reached. In this case the first and the last samples are also utilized for processing in the memory 2. Likewise, the program may run through the block 35 several times in the case of strong signal fluctuations until the minimum length No is reached.

FIG. 4 shows the variation of an unfiltered signal x(i) and a filtered signal y(i) over a section from $i=20$ to $i=90$. The threshold values are then chosen to be $S1=S2=7$. The value N1 was 10 (which corresponds to a maximum kernel length of 21) and the minimum value No was 0 which corresponds to a minimum kernel length of 1. It can be seen that in some ranges (with small signal fluctuations), for example between $i=20$ and $i=30$ or between $i=55$ and $i=60$ there is a strong signal smoothing, whereas in other ranges, for example in the range between 40 and 50 and in the range between 80 and 90 there is hardly any smoothing so that the strong signal transients present in these ranges are transmitted in a substantially undistorted form.

FIG. 5 shows the respective kernel lengths L used for smoothing the signal x(t) in FIG. 4 as a function of the sample i in the same range as in FIG. 4. It can be seen that the maximum kernel length in the signal section shown is not reached at any position, whereas the minimum kernel length reaches the value of 1 at several positions characterized each time by steep signal edges extending over a comparatively large range.

The method according to the invention may be used for filtering signals produced during X-ray photography by means of a photoconductor as described in prior German Patent Application P 40 06 181.7. The surface of a photoconductor, which is discharged to a greater or lesser extent by an X-ray is scanned line by line by means of one or several sensors detecting the surface charge and is subsequently digitized and stored. The sensors and the subsequently arranged electronic circuitry are subject to drift influences and the like which lead to striped artefacts extending parallel to the line direction in the subsequently reconstructed picture. These artefacts can be eliminated by a low-pass filtering perpendicular to the line direction. For ease of description, the line direction shall be referred to as a row and the direction perpendicular thereto, a column, without regard to how they may be positioned with regard to horizontal and vertical. To this end the signal source 1 (FIG. 2) should comprise a picture memory from which the picture values are read in such a sequence that neighbouring pixels and pixels perpendicularly to the line direction directly succeed one another. The filtered signal values can then again be rewritten into the picture memory, while it should only be ensured that the samples required in a kernel for computing the filtered values are buffered. If a (picture) memory is available in which the overall signal has been stored, it is not very useful to shift the signal within the memory so as to gain a kernel for the next sample position. In this case it is more efficient to change only the addresses of the required picture values by 1. As compared with the known method described in the opening paragraph, the cost of computing the filtered values $y_i$ is relatively slightly higher in the method according to the invention, while only the computing steps symbolized by blocks 32 to 35 and 37 should be additionally performed. In practice this results in a computing time which is only about 10% longer.

Under circumstances it may be useful for reasons of computing time to combine the computing steps in a different way.

When running through the program loop shown in FIG. 3, the kernel sum Su is computed twice under circumstances, namely once in block 31 and possibly once more in one of the blocks 33 or 35. This twofold computation can be avoided if the sum Su for the shifted kernel is not computed in block 31 but in a block to be added behind block 34. In this case the kernel sum should be increased by the two next $x_{i+n+1}$ and $x_{i+n+2}$ samples in block 33, whereas it should be reduced by the two kernel values $x_{i-n}$ and $x_{i-n-1}$ in block 35. In a program modified in this way the arithmetic mean value of the signals of the unshifted kernel would be compared with the next but one sample $(x_{i+n+2})$ in block 31.

I claim:

1. An image processing method comprising:
   scanning, row by row, a two-dimensional picture comprising an array of pixels arranged in columns and rows to obtain a first sequence of signal values, successive signal values of each row of said first sequence corresponding to respective successive pixels of said picture which are arranged in a line direction;
   storing said first sequence of signal values into a picture memory;
   reading a second sequence of signal values picture memory column by column in a manner that successive signal values of each column correspond to respective successive pixels of said picture which are arranged in a direction perpendicular to the line direction;
   generating a third sequence of filtered signal values by deriving each filtered signal value as a function of signal values comprised in a current kernel, said current kernel having a length consisting of L successive picture values of said second sequence and being shifted relative to said second sequence by one signal value position for each filtered signal value derived;
   forming a difference between a value derived from a current kernel and a signal value of said second sequence at a position proximate to and not previously comprised in said current kernel;
   incrementing the length of the current kernel to no more than a maximum length in case said difference is relatively small; and
   decrementing the length of the current kernel to no less than a minimum length in case said difference is relatively large.

2. A method as claimed in claim 1, wherein said difference is formed between a mean value of the signal values comprised in said current kernel and said signal value proximate to the current kernel, said incrementing step is performed when said difference is less than a first threshold value, and said decrementing step is performed when said difference does not fall below a second threshold value which at least as large as the first threshold value.

3. An image processing apparatus comprising:
   a sensors for scanning, row by row, a two-dimensional picture comprising an array of pixels arranged in rows and columns, to obtain a first sequence of signal values, successive signal values of each row of said first sequence corresponding to respective successive pixels of said picture which are arranged in a line direction;
   a picture memory for storing said first sequence of signal and for supplying a second sequence of signal values read from said picture memory column by column in a manner that successive signal values of each column correspond to respective successive pixels of said picture which are arranged in a direction perpendicular to the line direction; and
   processing means for generating a third sequence of filtered signal values by deriving each filtered signal value as a function of signal values comprised in a current kernel, said current kernel having a length consisting of L successive picture values of said second sequence and being shifted relative to said second sequence by one signal value position for each filtered signal value derived, for forming a difference between a value derived from a current kernel and a signal value of said second sequence at a position proximate to and not previously comprised in said current kernel, for incrementing the length of the current kernel to no more than a maximum length in case said difference is relatively small, and for decrementing the length of the current kernel to no less than a minimum length in case said difference is relatively large.

4. An apparatus as claimed in claim 1, wherein said difference is formed by said processing means between a mean value of the signal values comprised in said current kernel and said signal value proximate to the current kernel, said incrementing by said processing means is when said difference is less than a first threshold value, and said decrementing by said processing means is when said difference does not fall below a second threshold value which at least as large as the first threshold value.

* * * * *